US009456525B2

(12) United States Patent
Yoon et al.

(10) Patent No.: US 9,456,525 B2
(45) Date of Patent: Sep. 27, 2016

(54) DIGITAL SIGNAGE

(71) Applicant: LG ELECTRONICS INC., Seoul (KR)

(72) Inventors: Donghee Yoon, Pyeongtaek-si (KR); Injae Chin, Pyeongtaek-si (KR); Dongjune Kim, Pyeongtaek-si (KR); Sungwook Han, Pyeongtaek-si (KR); Jiyong Lee, Pyeongtaek-si (KR)

(73) Assignee: LG Electronics Inc., Seoul (KR)

( * ) Notice: Subject to any disclaimer, the term of this patent is extended or adjusted under 35 U.S.C. 154(b) by 166 days.

(21) Appl. No.: 14/135,508

(22) Filed: Dec. 19, 2013

(65) Prior Publication Data
US 2014/0334100 A1 Nov. 13, 2014

(30) Foreign Application Priority Data

May 9, 2013 (KR) .................. 10-2013-0052372

(51) Int. Cl.
*H05K 7/20* (2006.01)
*G06F 1/16* (2006.01)
*G06F 1/20* (2006.01)
*G09F 9/33* (2006.01)
*G09F 9/35* (2006.01)
*G02F 1/1333* (2006.01)

(52) U.S. Cl.
CPC ......... *H05K 7/20145* (2013.01); *G06F 1/1601* (2013.01); *G06F 1/20* (2013.01); *G09F 9/33* (2013.01); *G09F 9/35* (2013.01); *H05K 7/20972* (2013.01); *G02F 1/133385* (2013.01)

(58) Field of Classification Search
CPC ............... H05K 7/20145; H05K 7/20972; G06F 1/1601; G02F 1/133385
See application file for complete search history.

(56) References Cited

U.S. PATENT DOCUMENTS 6,688,965 B1 * 2/2004 Crippen ............ H05K 7/20181
361/695
6,885,554 B1 * 4/2005 Reeck ............... H05K 7/20572
361/695

(Continued)

FOREIGN PATENT DOCUMENTS

| CN | 1797665 A | 7/2006 |
| CN | 201556377 U | 8/2010 |
| CN | 201846555 U | 5/2011 |

*Primary Examiner* — David M Sinclair
*Assistant Examiner* — Robert Brown
(74) *Attorney, Agent, or Firm* — Birch, Stewart, Kolasch & Birch, LLP

(57) ABSTRACT

There are disclosed a digital signage including a display panel, a first support panel coupled to a rear surface of the display panel, the first support panel comprising a plurality of first grooves formed in one direction, a second support panel coupled to a rear surface of the first support panel, the second support panel comprising a plurality of second grooves formed in an orthogonal direction with respect to the first grooves, a driving circuit board provided in a rear surface of the second support panel to control driving of the display panel, and a case comprising the display panel arranged in one surface thereof and an inner space where the first support panel, the second support panel and the driving circuit board are mounted, wherein both ends of the first grooves are open toward the inner space of the case to induce air flow in the case, and both ends of the second grooves are in communication with the outside via a hole formed in the case to flow external air there through, such that the support structure of the display panel may be used in exhausting the heat generated in the display panel and the circuit board effectively.

4 Claims, 13 Drawing Sheets

(56) References Cited

U.S. PATENT DOCUMENTS

| | | | |
|---|---|---|---|
| 2003/0067419 A1* | 4/2003 | Lambert | G06F 1/1601 345/1.1 |
| 2004/0165139 A1* | 8/2004 | Anderson | G02F 1/133382 349/155 |
| 2005/0061155 A1* | 3/2005 | Franey | B01D 46/0086 96/421 |
| 2005/0062383 A1* | 3/2005 | Bae | H05K 7/20963 313/44 |
| 2005/0088817 A1* | 4/2005 | Ou Yang | H05K 7/20181 361/695 |
| 2005/0266231 A1* | 12/2005 | Lin | G02F 1/133385 428/317.9 |
| 2006/0125365 A1* | 6/2006 | Kim | H05K 5/02 313/46 |
| 2006/0198101 A1* | 9/2006 | Cho | G06F 1/1616 361/679.46 |
| 2007/0242428 A1* | 10/2007 | Lin | G06F 1/20 361/692 |
| 2008/0068798 A1* | 3/2008 | Hendrix | H05K 7/206 361/696 |
| 2008/0117575 A1* | 5/2008 | Kang | G06F 1/1601 361/679.01 |
| 2009/0244834 A1* | 10/2009 | Sugimori | H04M 19/04 361/679.55 |
| 2011/0007474 A1* | 1/2011 | Detore | G01N 33/92 361/679.48 |
| 2011/0013114 A1* | 1/2011 | Dunn | H05K 7/202 349/61 |
| 2011/0051369 A1* | 3/2011 | Takahara | H05K 7/20972 361/696 |
| 2011/0058326 A1* | 3/2011 | Idems | G09F 9/30 361/679.21 |
| 2011/0075363 A1* | 3/2011 | Nakamichi | G09F 9/35 361/696 |
| 2011/0085301 A1* | 4/2011 | Dunn | H05K 7/20154 361/695 |
| 2011/0085302 A1* | 4/2011 | Nakamichi | H05K 7/20972 361/695 |
| 2011/0120067 A1* | 5/2011 | Kim | B01D 46/521 55/385.1 |
| 2011/0155365 A1* | 6/2011 | Wiese | F24F 7/013 165/244 |
| 2011/0159795 A1* | 6/2011 | Sprague | H05K 7/20181 454/184 |
| 2011/0162831 A1* | 7/2011 | Lee | H05K 7/20972 165/287 |
| 2012/0014062 A1* | 1/2012 | Siracki | H05K 7/20163 361/692 |
| 2012/0106106 A1* | 5/2012 | Katou | H04M 1/0216 361/752 |
| 2012/0255721 A1* | 10/2012 | Kim | G02F 1/133382 165/288 |
| 2012/0275087 A1* | 11/2012 | Corey | A47B 91/005 361/679.01 |
| 2013/0163200 A1* | 6/2013 | Takahashi | H05K 7/20972 361/692 |
| 2015/0109733 A1* | 4/2015 | Horiuchi | H05K 7/20136 361/695 |

* cited by examiner

FIG. 3
130,140
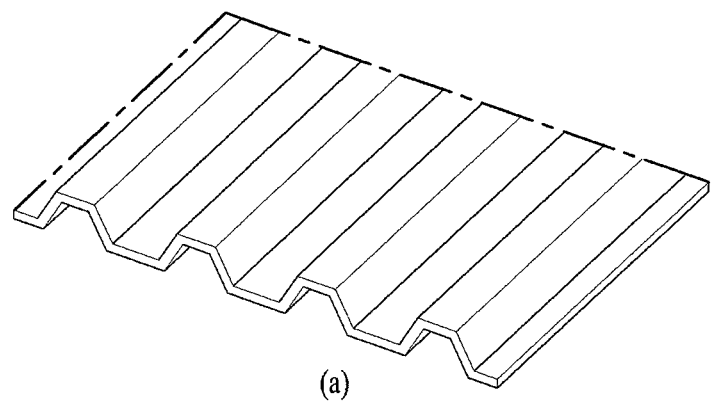
(a)
130,140
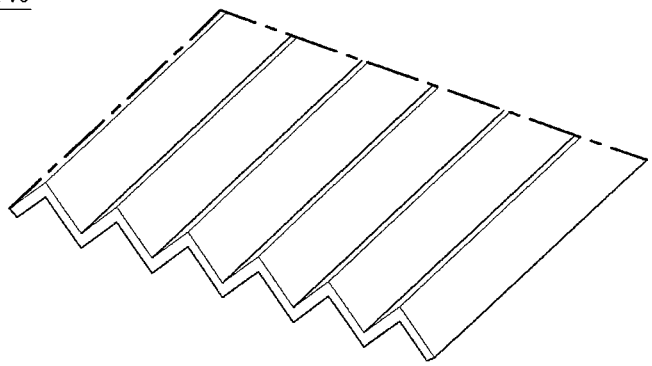
(b)
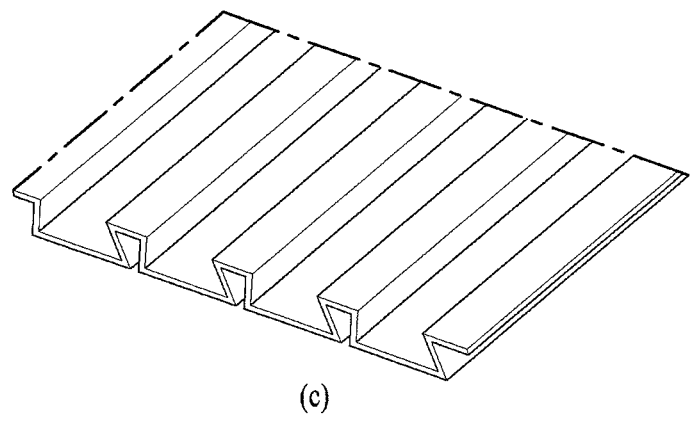
(c)

DIGITAL SIGNAGE

Pursuant to 35 U.S.C. §119(a), this application claims the benefit of earlier filing date and right of priority to Korean Application No. 10-2013-0052372, filed on May 9, 2013, the contents of which are hereby incorporated by reference herein in their entirety.

BACKGROUND OF THE DISCLOSURE

1. Field of the Disclosure

The present invention relates to a slim-designed digital signage that may emit the heat generated in a display panel and a driving circuit board.

2. Discussion of the Related Art

Recently, a digital signage that provides various contents and messages via a display panel has been used as opposed to a hardware media as a signboard and a poster for outdoor advertisement. With rapid development of intelligent digital video devices based on LCDs or LEDs, demands for such digital signage have been increasing recently.

SUMMARY OF THE DISCLOSURE

To overcome the disadvantages, an object of the present invention is to a digital signage having a slim design that is able to exhaust the heat generated from a display panel and a driving circuit board effectively.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital signage includes a display panel; a first support panel coupled to a rear surface of the display panel, the first support panel comprising a plurality of first grooves formed in one direction; a second support panel coupled to a rear surface of the first support panel, the second support panel comprising a plurality of second grooves formed in an orthogonal direction with respect to the first grooves; a driving circuit board provided in a rear surface of the second support panel to control driving of the display panel; and a case comprising the display panel arranged in one surface thereof and an inner space where the first support panel, the second support panel and the driving circuit board are mounted, wherein both ends of the first grooves are open toward the inner space of the case to induce air flow in the inner space of the case, and both ends of the second grooves are in communication with the outside via a hole formed in the case to flow external air there through.

The first grooves and the second grooves may be formed of one metallic plate that is folded.

The first groove and second groove may have a cross section that has at least one of triangular, trapezoidal, rectangular and semicircular shapes.

At least one of the first and second support panels may have the grooves toward one surface that are relatively larger than the grooves toward the other surface.

At least one of the first support panel and the second support panel has the grooves toward one surface and the grooves toward the other surface that are large symmetrically.

The digital signage may further include a separation plate disposed between the first support panel and the second support panel.

The digital signage may further include a back plate formed between a rear surface of the second support panel and the driving circuit board.

The digital signage may further include a first cooling fan provided in the case configured to induce air inside the case along the first grooves.

The digital signage may further include a second cooling fan to induce external air along the second grooves.

The first grooves may be formed in a horizontal direction and the second grooves may be formed in a vertical direction.

The case may further include a glass spaced apart a predetermined distance from a front surface of the display panel; and an air curtain formed between the glass and the front surface of the display panel to make air flow in an orthogonal direction with respect to the first grooves, and both ends of the air curtain may be connected to both ends of the second grooves.

The digital signage may further include a filter provided in an inlet where external air is drawn into the air curtain.

The first grooves may be formed in a vertical direction and the second grooves are formed in a horizontal direction.

The case further include a glass spaced apart a predetermined distance from a front surface of the display panel; and an air curtain formed between the glass and the display panel to make air flow in a parallel direction with respect to the first grooves.

A plurality of first or second support panels may be provided.

In another aspect, a digital signage includes a pair of display panels; a pair of first support panels coupled to rear surfaces of the display panels, respectively, the pair of the first support panels comprising a plurality of first grooves formed in one direction, respectively; a pair of second support panels coupled to rear surfaces of the first support panels, respectively, the pair of the second support panels comprising a plurality of second grooves formed in an orthogonal direction with respect to the first grooves; a case comprising one surface where one of the display panels is arranged and the other surface where the other display panel is arranged and an inner space where the pair of the first support panels and the pair of the second support panels are mounted; and a driving circuit board provided between the pair of the second support panels to control driving of the display panels, wherein both ends of the first grooves are open toward the inner space of the case to induce air flow in the inner space of the case, and both ends of the second grooves are in communication with the outside via a hole formed in the case to flow external air there through.

The case may further include a pair of glasses spaced apart a predetermined distance from front surfaces of the display panels, respectively; and a pair of air curtains formed between the glasses and the front surfaces of the display panels, respectively, to make air flow in an orthogonal direction with respect to the first grooves, and both ends of the air curtains are connected to both ends of the second grooves.

The digital signage may further include a filter provided in an inlet formed in each of the air curtains to draw external air therein.

The first grooves and the second grooves may be formed of one metallic plate that is folded, and the first groove and second groove may have a cross section that has at least one of triangular, trapezoidal, rectangular and semicircular shapes.

According to at least one of the embodiments described above, the support structure of the display panel may be used in exhausting the heat generated in the display panel and the circuit board effectively.

Furthermore, no auxiliary passage is formed for heat radiation or no filter member is provided such that the size of the digital signage cannot be increased least. Accordingly, a slim-designed digital signage can be realized and the number of the members can be reduced such that the manufacture cost and the number of manufacture processes can be reduced.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 3 is a perspective diagram illustrating a first or second support panel according to one embodiment provided in the digital signage;

DESCRIPTION OF SPECIFIC EMBODIMENTS

Referring to the accompanying drawings, a digital signage according to embodiments will be described in detail as follows. It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

Figure 1:
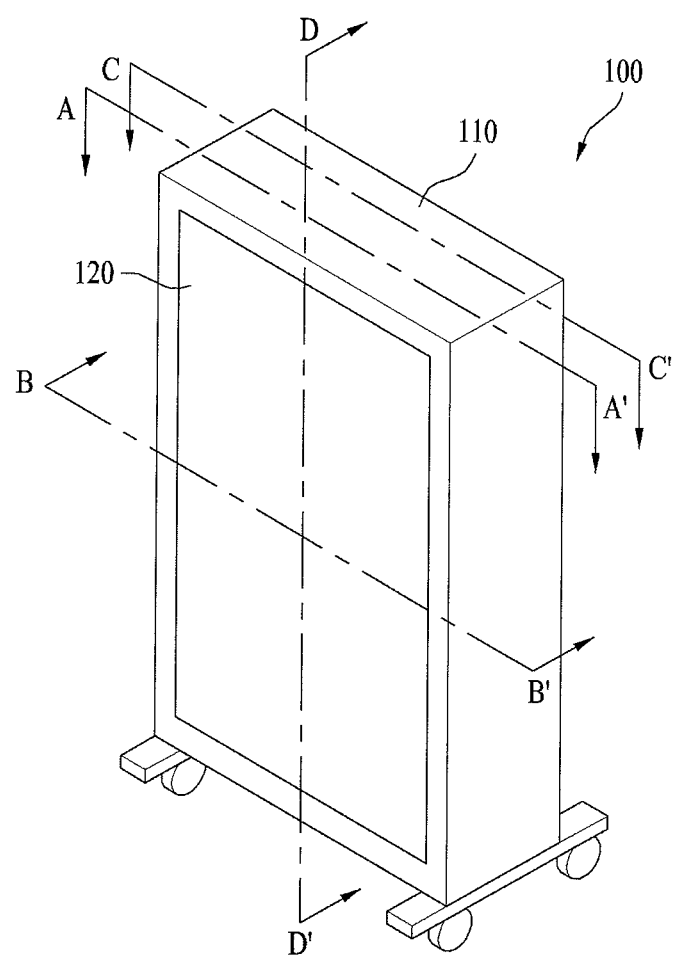
FIG. 1 is a perspective diagram illustrating an exterior appearance of a digital signage according to one embodiment of the present invention.

FIG. 1 is a perspective diagram illustrating an exterior appearance of a digital signage according to one embodiment of the present invention. As shown in FIG. 1, the digital signage 100 includes a display panel 120 arranged on a front surface thereof and a case 110 having various components arranged therein. In this embodiment, the display panel 120 may be provided only in the front surface of the digital signage. However, in other embodiments which will be described later, the display panel 120 may be provided in each of front and rear surfaces.

Figure 2:
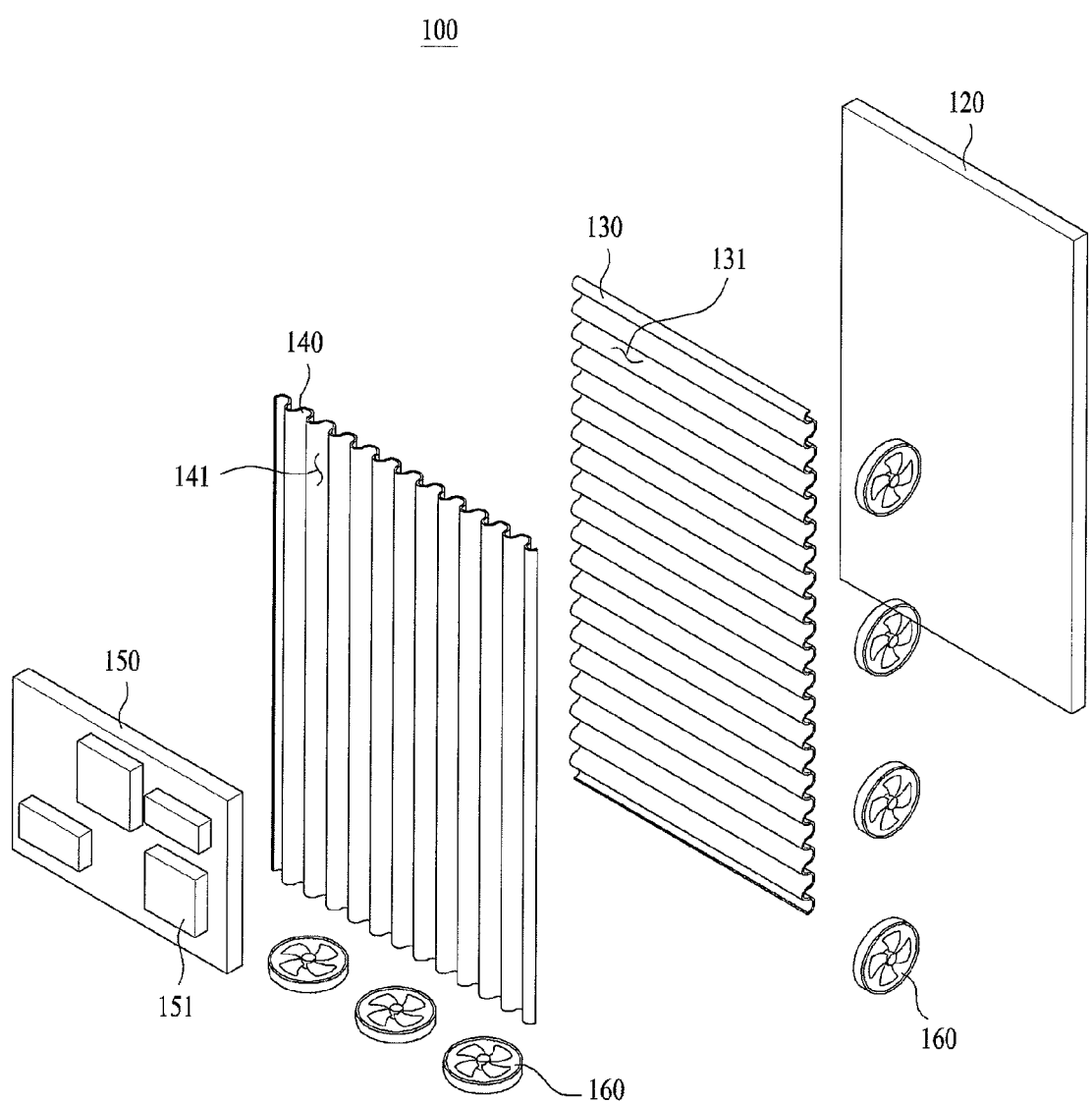
FIG. 2 is an exploded perspective diagram illustrating an interior structure of the digital signage according to the embodiment of the present invention.

FIG. 2 is an exploded perspective diagram illustrating an interior structure of the digital signage according to the embodiment of the present invention. FIG. 2 shows key components arranged in the case 110 shown in FIG. 1. In the case 110 may be arranged the display panel 120 exposed to a front surface of the case 110 and a first support panel 130, a second support panel 140, a driving circuit board 150 and a cooling fan 160 that are provided behind a rear surface of the display panel 120.

The display panel 120 may include at least one of a liquid crystal display (LCD), a thin film transistor-liquid crystal display (TFT LCD), an organic light-emitting diode (OLED), a flexible display and a 3D display.

The display panel 120 may consist of thin films or thin-film type plate members disposed sequentially and it has a disadvantage of warping easily. To prevent such panel warp, a support panel having a predetermined rigidity may be used and a metallic material having a high rigidity such as iron may be used. However, as the size of the display panel is getting larger in the digital signage 100, it is difficult to prevent the warp even in case of using a high rigidity material.

Accordingly, grooves 131 and 141 may be formed in the support panels 130 and 140 configured to support the rear surface of the display panel 120 so as to enhance a resistance to the warp. Especially, the grooves 131 and 141 orthogonal to each other are formed in the two support panels 130 and 140, respectively. As shown in FIG. 2, the first support panel 130 has a plurality of first grooves 131 formed in a predetermined direction and the second support panel 140 has a plurality of second grooves 141 formed in an orthogonal direction with respect to the direction of the first grooves 131.

The grooves formed only in one direction may be highly resistant to warp in one direction but insufficiently resistant to warp in the orthogonal direction. Accordingly, the first grooves 131 and the second grooves 141 orthogonal to each other may be provided to enhance a supporting force that acts to resist to the warp in all directions.

In this embodiment, the first grooves 131 may be longitudinally formed in a horizontal direction and the second grooves 141 may be longitudinally formed in a vertical direction. However, the embodiment is not limited thereto and the first grooves 131 may be longitudinally formed in a vertical direction and the second grooves 141 may be longitudinally formed in a horizontal direction.

A deck plate formed of one metallic plate that is folded or bent may be used as each of the first support panel 130 and the second support panel 140. A corrugation-shaped deck plate in which grooves having a semicircular cross section are serially formed as shown in FIG. 2 may be used. Alternatively, a deck plate in which grooves having a trapezoidal cross section are serially formed as shown in FIG. 3 (a) or a deck plate in which grooves having a zigzag-shaped cross section are serially formed as shown in FIG. 3 (b).

As shown in embodiments of FIGS. 2, 3 (a) and 3 (b), grooves formed in one surface and grooves formed in the other surface may be in symmetry. Alternatively, as shown in FIG. 3 (c), grooves formed in one surface may have a larger area than grooves formed in the other surface. In case the grooves formed in one surface are larger, only the grooves formed in one surface may be used as passages. In case the grooves formed in one surface and the other surface are symmetrical to each other, the grooves formed in both surfaces may be used as passages.

The thickness of each support panel 130 and 140 may be increased to enhance the rigidity or the gaps between the grooves 131 and 141 may be adjusted to enhance the rigidity. Alternatively, more than one panel as the support panel 130 or 140 may be overlapped to enhance the rigidity.

The driving circuit board 150 configured to control a screen of the display panel 120 may be disposed behind the two support panels 130 and 140. Various circuit elements 151 are provided on the driving circuit board 150 and they apply a voltage signal for realizing an image and supply the power.

Such the driving circuit board 150 is electrically connected with the display panel 120 and it transmits a driving signal to the display panel. A cable or a flexible printed circuit may be used in the electrical connection between the driving circuit board and the display panel 120.

The circuit elements 151 provided in the driving circuit board 150 may include an intelligent power module (IPM) that consumes much power. Once put into operation, such an IPM generates a lot of heat. If the circuit element consuming much power is overheated, it is impossible to stop the operation of the circuit element and it is necessary to radiate the heat generated from the circuit elements 151 effectively.

The display panel 120 realizes a high brightness to secure the visibility even in bright circumstances and the size of the display panel 120 has been getting larger, such that the display panel 120 may generate relatively much heat, compared with a conventional display device. In case the display panel 120 is overheated, an image quality of the display panel 120 could be affected and it is necessary to radiate the heat exhausted from the display panel 120.

In case of using the structure configured to make an outside and an inside in communication with each other to exhaust the heat generated in the digital signage, external foreign substances, sands and humidity might come into the digital signage and deteriorate the durability of the digital signage 100. To overcome such a disadvantage of deteriorated durability, a complex passage having a filter to prevent the penetration of foreign substances could be used. In this instance, the size of the digital signage 100 ends up with increasing and an installation space is limited only to deteriorate a design quality.

The embodiments of the present invention uses the support panels 130 and 140 of the display panel 120 as a heat radiation structure, to overcome the disadvantage of foreign substances penetration caused by the communication with the outside and the disadvantage of the increased size.

The grooves 131 and 141 formed in the support panels 130 and 140, respectively, may provide passages of air for emitting the heat. The flow of the air along the first grooves 131 of the first support panel 130 is distinguished from the air flow along the second grooves 141 of the second support panel 140, such that the passages in communication with the outside may be distinguished from the passages in communication with the inside of the digital signage to prevent foreign substances from being mixed with the air flowing in the case 110.

The air flowing in the case 110 may not be mixed with the air drawn from the outside. Accordingly, a filter 170, such as that shown in FIG. 8, may be omitted and the passages using the grooves 13 and 141 formed in the support panels 130 and 140 may be simplified.

Referring to FIGS. 4 to 7, the air passages mentioned above will be described in detail as follows.

The first grooves 131 formed in the first support panel 130 are open toward an inner space 113 of the case 110 and they induce the air flow in the inner space 113 of the case. The second grooves 141 formed in the second support panel 140 are in communication with the outside via an opening formed in the case 110 to draw or exhaust external air therein or there from. Accordingly, such the first and second grooves 131 and 141 may be configured to exhaust the heat generated in the driving circuit board 150 and the display panel 120 arranged in the case 110 outside.

Figure 4:
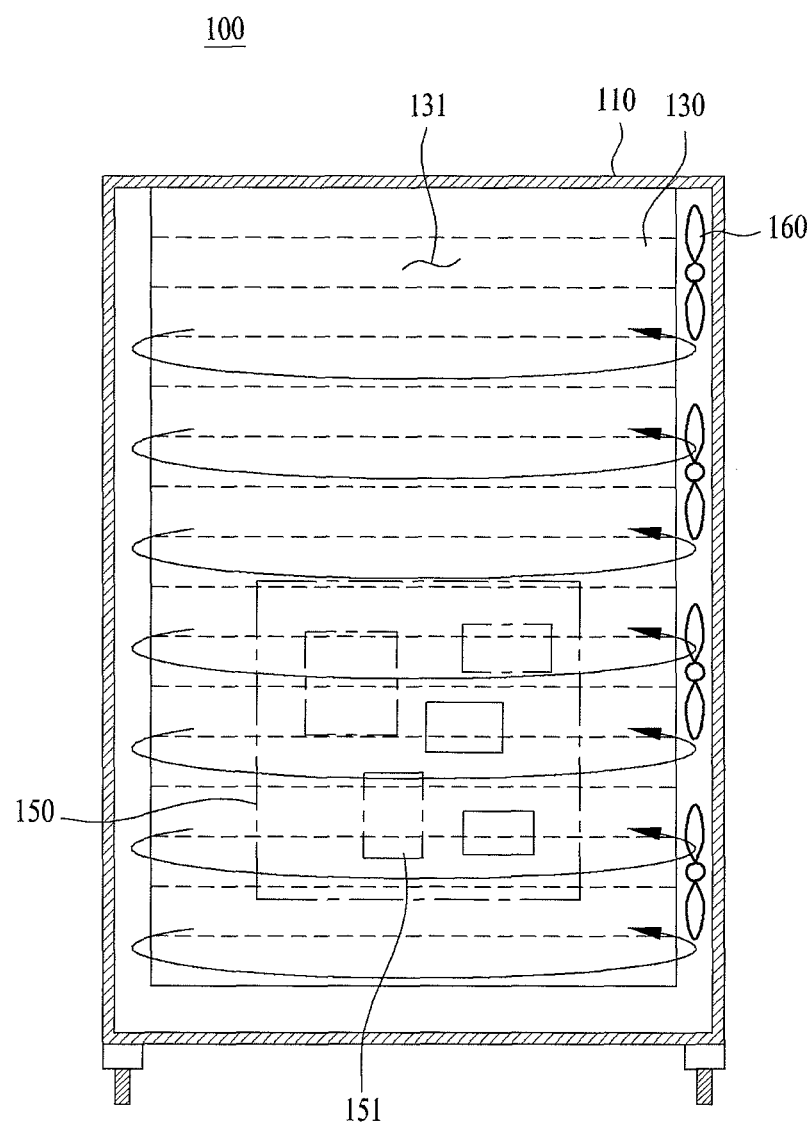
FIG. 4 is a sectional diagram of A-A' shown in FIG. 1.

FIG. 4 is a sectional diagram of A-A' shown in FIG. 1 to show flow of air along the first grooves 131 of the first support panel 130. The air is flowing along a longitudinal direction of the first grooves 131 (a horizontal direction in the drawing) and a cooling fan 160 may be further provided to induce the air flow along the longitudinal direction of the first grooves 131. The first grooves 131 are open toward the inner space 113 of the case and shut off from the outside, such that the air may be continuously circulated in the inner space of the case along the first grooves 131, without being mixed with the external air.

Figure 5:
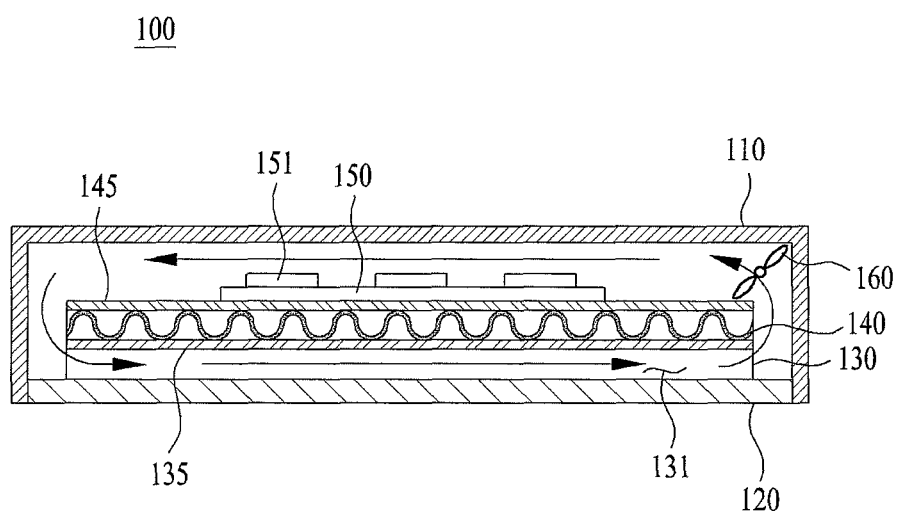
FIG. 5 is a sectional diagram of B-B' shown in FIG. 1.

FIG. 5 is a sectional diagram of B-B' shown in FIG. 1. The air having passed the first grooves 131 is flowing to a rear surface of the second support panel 140 and circulated, with the heat of the driving circuit board 150. In other words, the air having passed the first grooves 131 of the first support panel 130 is configured to uniformly disperse the heat inside the space 113 of the case, while being circulated in the inner space 113.

As shown in FIG. 5, a separation plate 135 may be further provided between the first support panel 130 and the second support panel 140 to separate the air flow along the first grooves 131 from the air flow along the second grooves 141. A back plate 145 may be further provided between the second support panel 140 and the driving circuit board 150 to separate the air flow along the second grooves 141 from the air flow in the inner space 113 of the case.

Figure 6:
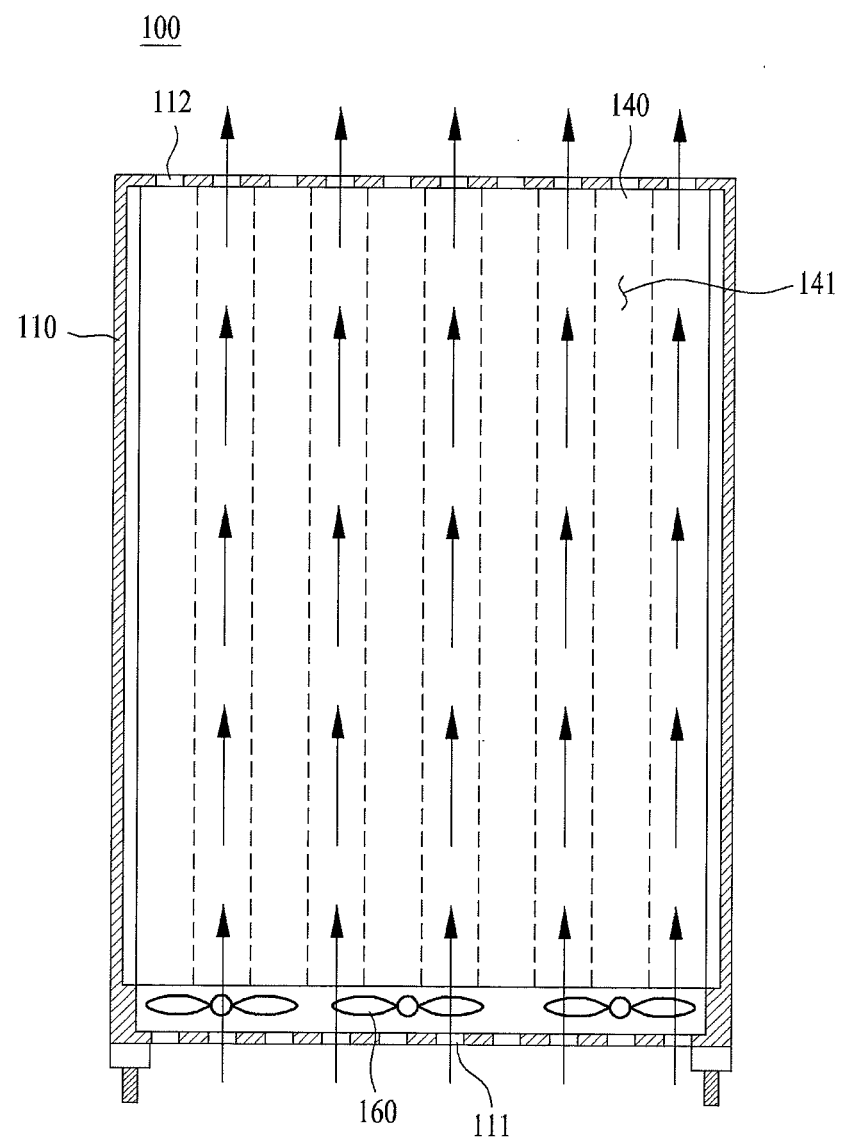
FIG. 6 is a sectional diagram of C-C' shown in FIG. 1.

FIG. 6 is a sectional diagram of C-C' shown in FIG. 1 and shows flow of air along the second grooves 141 of the second support panel 140. The air is flowing along a longitudinal direction of the second grooves 141 (a vertical direction in the drawing) and a cooling fan 160 may be further provided to induce the air flow along the longitudinal direction of the second grooves 141. As mentioned above, the second grooves are in communication with the outside of the case 110 via an opening formed in the case 110 and they show flow along one direction.

Air is drawn via a first hole 111 connected to an end of the second groove 141 and the air is exhausted via a second hole 112 connected to the other end of the second groove 141, such that the heat may be exhausted constantly. As shown in FIG. 5, the air inside the inner space 113 of the case is circulated around the second support panel 140, such that external air passing the second grooves 141 of the second support panel 140 and the air inside the inner space 113 of the case may exhaust the heat in the inner space 113 through heat-exchanging.

Figure 7:
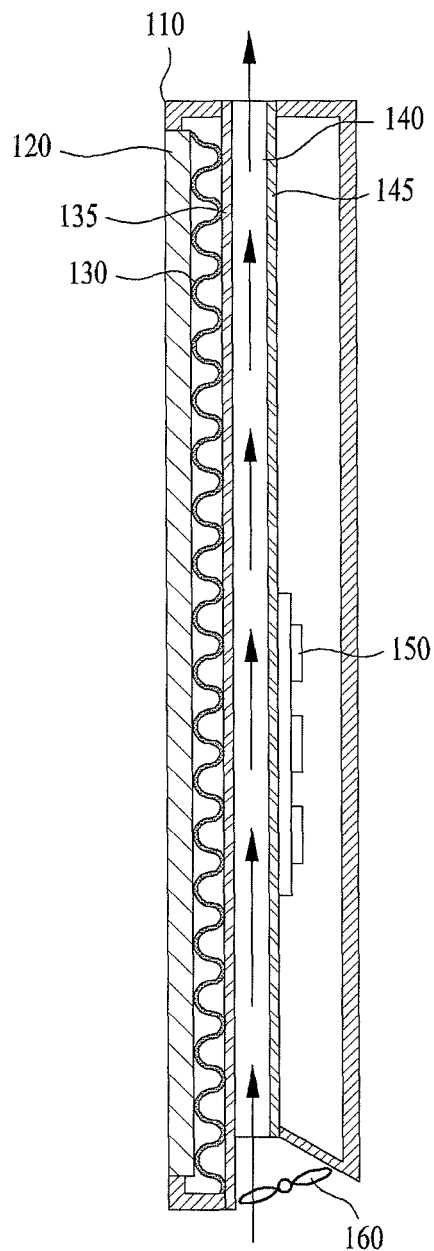
FIG. 7 is a sectional diagram of E-E' shown in FIG. 1.

FIG. 7 is a sectional diagram of E-E' shown in FIG. 1 that illustrates that external air is flowing via the second grooves 141. The second grooves 141 are separated from the inner space 113 of the case and the first grooves 131. Accordingly, the air passing the second grooves 141 may not affect the components arranged in the case 110 even if it contains foreign substances. Only if they are washed, the second grooves 141 can be used constantly without the filter 170.

Figure 8:
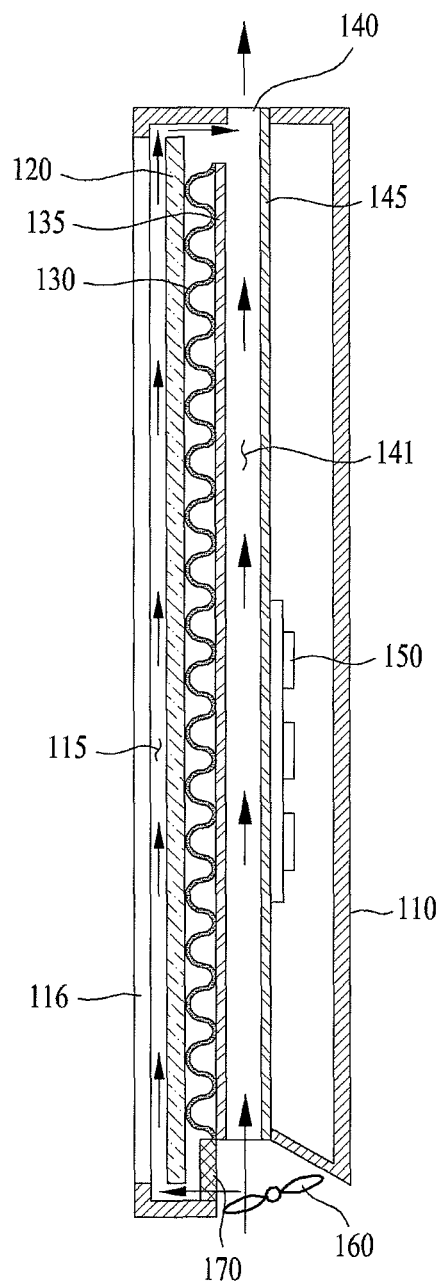
FIG. 8 is a sectional diagram longitudinally illustrating a digital signage according to another embodiment of the present invention.

FIG. 8 is a sectional diagram longitudinally illustrating a digital signage according to another embodiment of the present invention. In this embodiment, the flow of air passing first grooves 131 is the same as in the embodiment mentioned above. However, a predetermined amount of the external air passing the second grooves 141 may pass an air curtain 115 provided in a front surface of the display panel 120 in this embodiment.

The air curtain 115 is configured to emit the heat generated from a front surface of the display panel 120. In this embodiment, a front glass 116 is additionally provided in a front surface of the display panel 120, spaced apart a predetermined distance from the display panel 120, to form the air curtain 115 between the display panel 120 and the front glass 115. The air passing the air curtain 115 may absorb the heat of the display panel 120.

As shown in FIG. 8, a predetermined amount of the external air drawn in the second grooves 141 is moved to the air curtain 115, such that the heat may be absorbed even from the front surface of the display panel 120 to improve the heat radiation function. To suck the air drawn to the second grooves 141 to the air curtain partially, the vertical size of the separation plate between the first grooves and the second grooves may be smaller than that of the separation plate according to the embodiment mentioned above.

In the embodiment shown in FIG. 8, the air curtain 115 is further provided to improve the heat radiation function in case only the heat radiation structure mentioned in the embodiment above is insufficient to exhaust the heat of the digital signage 100, because the heat generated in the display panel 120 is too much.

In this instance, external air is moving along the front surface of the display panel 120. If foreign substances or humidity is contained in the air moving along the front surface of the display panel 120, there might be a problem of hiding the screen of the display panel 120.

For a clean screen, the air need to be filtered by a filter 170 to filter foreign substances, before passing the air curtain 115. As shown in FIG. 8, the filter 170 may be further provided in an inlet where the air is drawn into the air curtain 115.

Figure 9:
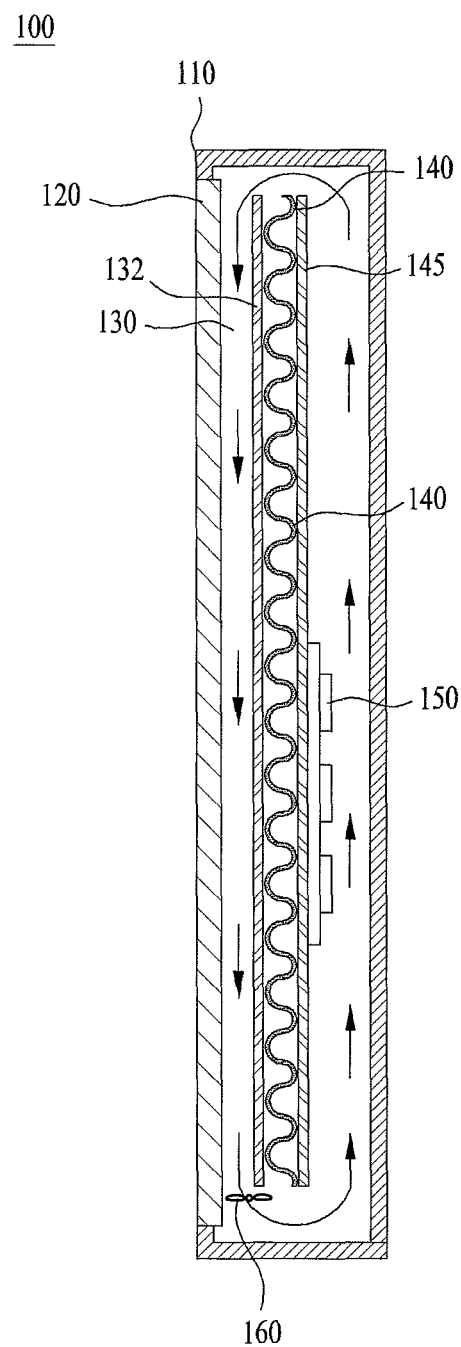
FIG. 9 is a sectional diagram longitudinally illustrating a digital signage according to a further embodiment of the present invention.
Figure 10:
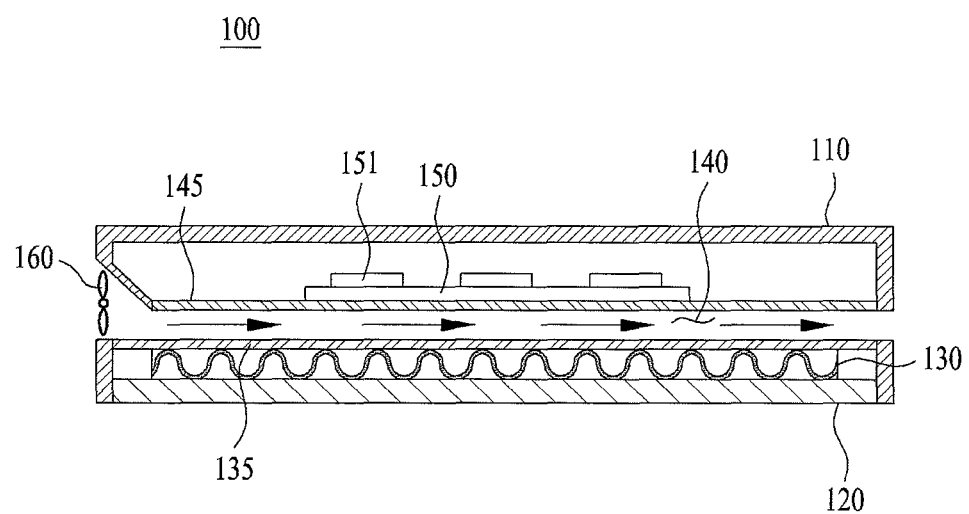
FIG. 10 is a sectional diagram horizontally illustrating a digital signage according to the embodiment of the present invention.

FIG. FIGS. 9 and 10 are sectional diagrams longitudinally illustrating a digital signage according to a further embodiment of the present invention. In this embodiment, a first support panel 130 has first grooves 131 formed in a vertical direction and a second support panel 140 has second grooves 141 formed in a horizontal direction. The second support panel 140 is arranged in a horizontal direction and the case 110 is open in a right and left direction. The first support panel 130 is arranged in a vertical direction and the air passing the driving circuit board is flowing in an up and down direction.

Figure 11:
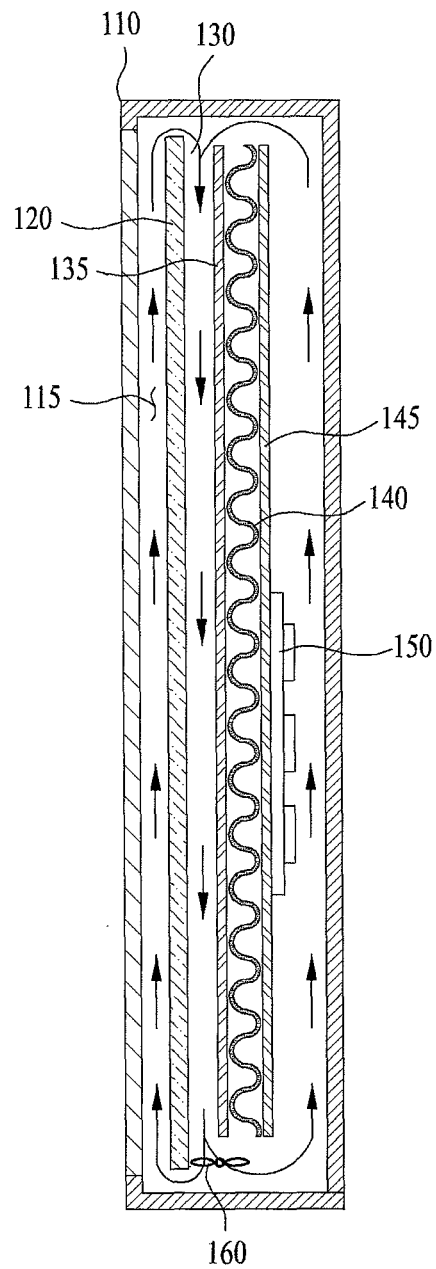
FIG. 11 is a sectional diagram longitudinally illustrating a digital signage according to a still further embodiment of the present invention.

FIG. 11 is a longitudinal sectional diagram illustrating a digital signage according to a still further embodiment that further includes an air curtain 115 provided in a front surface thereof. In this embodiment, the air curtain 115 is connected to the first grooves 131 and the air circulating in the case 110 passes the air curtain 115. The inner space of the case 110 is shut off and air is stopped from coming into the inner space of the case 110, such that dust or foreign substances may not be drawn into the inner space. Accordingly, the heat emitted from the display panel 120 can be diffused while the air is passing the air curtain 115, even without the filter provided in the embodiment shown in FIG. 8.

In this embodiment, the air absorbing the heat while circulating in the inner space of the case having the driving circuit board 150 mounted therein and the air absorbing the heat while passing the air curtain 115 may pass the first grooves 131 and transfer the heat to the second grooves 141 to diffuse the heat.

Figure 12:
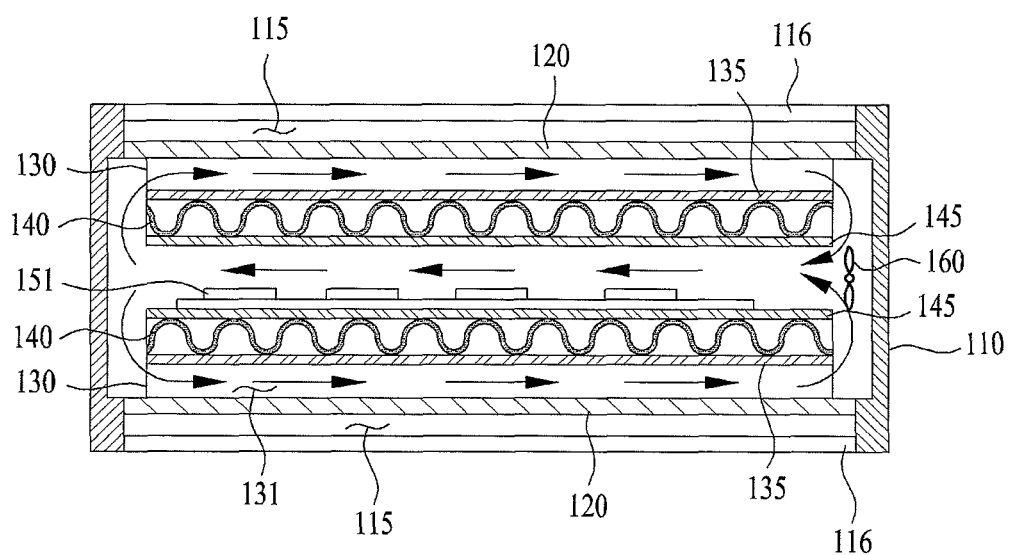
FIG. 12 is a sectional diagram horizontally illustrating a digital signage according to the embodiment of the present invention.
Figure 13:
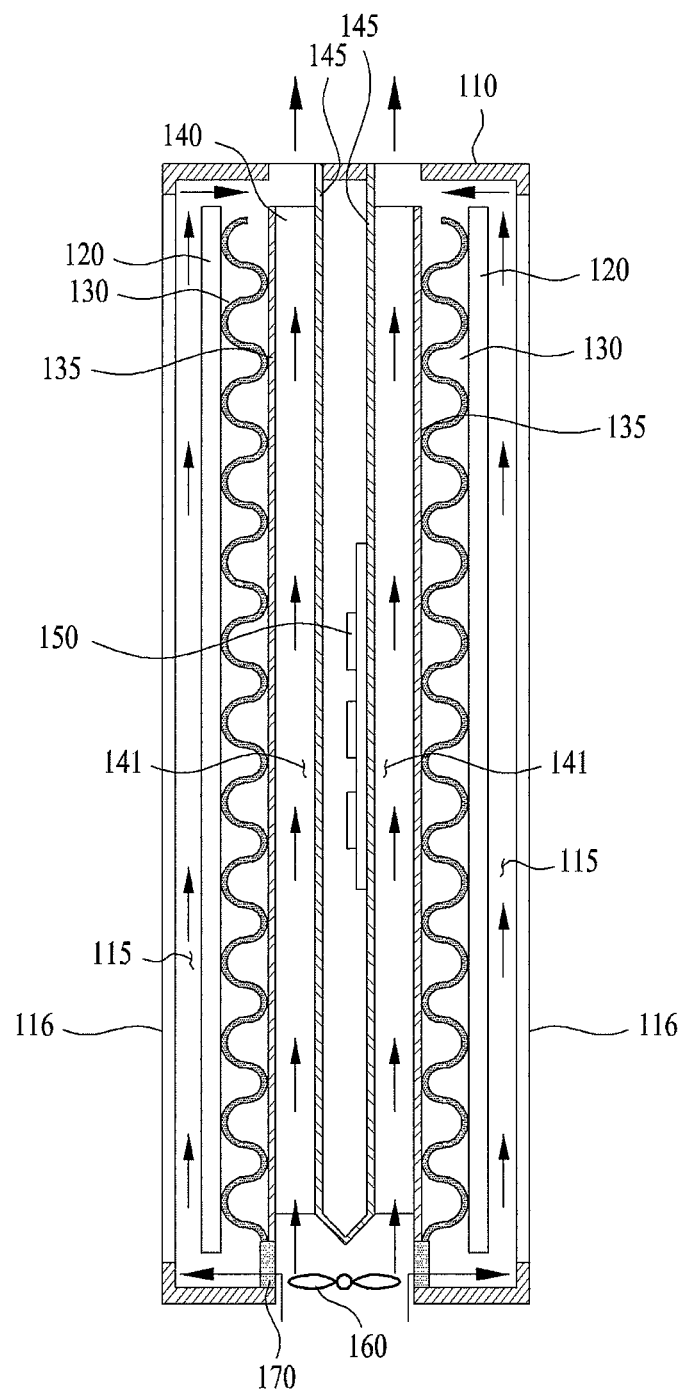
FIG. 13 is a sectional diagram longitudinally illustrating a digital signage according to a still further embodiment of the present invention.

FIG. 12 is a sectional diagram horizontally illustrating a digital signage according to the embodiment of the present invention and FIG. 13 is a sectional diagram longitudinally illustrating a digital signage according to a still further embodiment of the present invention. In this embodiment, display panels 120 are provided in front and rear surfaces of the case, respectively. The two panels 120 are provided and one driving circuit board 150 is used in the drawings. However, the circuit elements 151 that are approximately twice as many as the circuit elements 151 mentioned in the embodiment and the heat generated in the inner space 113 of the case is increased much more.

In this instance, it is preferable that the air curtain 115 is further provided in the front surface of the display panel to enhance the heat radiation effect, similar to the embodiment shown in FIG. 8. The embodiment shown in FIGS. 12 and 13 is basically similar to the embodiment shown in FIG. 8, except that the display panels 120 are provided in both surfaces of the case to form air flow in both directions.

As shown in FIG. 12, the air flowing along first grooves 131 formed in the pair of the first display support panels provided in rear surfaces of the pair of the display panels 120 may be collected in an edge portion to pass the driving circuit board 150. The air having passed the driving circuit board 150 is divided again to both of the first grooves 131. Even in this embodiment, a cooling fan 160 may be provided to make the air flow along the driving circuit board 150 and the first grooves 131 in the inner space 113 of the case performed smoothly.

As shown in FIG. 13, the flow of external air passing the second grooves 141 is divided in four ways. In the embodiment shown in FIG. 8, one display panel 120 is provided and the air flow is divided in two ways toward the air curtain 115 positioned in the front surface of the display panel 120 and the second grooves 141. However, in this embodiment, two display panels 120 are provided and the air flow is divided in four ways. At this time, the second display panel 120 not having the driving circuit board 150 may be omitted to make the thickness much thinner.

In case the air curtain 115 is provided, a filter 170 may be further provided in an inlet of the air curtain 115 to prevent foreign substances from being drawn into the air curtain 115. When digital signage 100 is installed in an area having a low atmospheric temperature to radiate the heat of the digital signage 110 easily, the air curtain 115 may be omitted and the flow of the external air may be divided in two ways to make the air pass only the second grooves 141, like in the embodiment of FIG. 4.

According to at least one of the embodiments described above, the support structure of the display panel 120 may be used in exhausting the heat generated in the display panel and the circuit board effectively.

Furthermore, no auxiliary passage is formed for heat radiation or no filter member is provided such that the size of the digital signage 100 cannot be increased least. Accordingly, a slim-designed digital signage can be realized and the number of the members can be reduced such that the manufacture cost and the number of manufacture processes can be reduced.

When a particular feature, structure, or characteristic is described in connection with any embodiment, it is submitted that it is within the purview of one skilled in the art to affect such feature, structure, or characteristic in connection with other ones of the embodiments. Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A digital signage comprising:
a pair of display panels, each display panel having an outward facing, first surface and an inward facing, second surface;
a pair of first support panels coupled to respective second surfaces of the pair of display panels, each of the first support panels having a plurality of first grooves formed in a first direction;
a pair of second support panels coupled to inward facing surfaces of the first support panels, respectively, each of the second support panels having a plurality of second grooves formed in a second direction, the second direction being orthogonal to the first direction;
a pair of separation plates disposed between the first support panels and the second support panels; and
a driving circuit board provided between the pair of the second support panels to control driving of the display panels.

2. The digital signage according to claim 1, further comprising a case having a first surface where one of the pair of display panels is arranged, a second surface where the other of the pair of display panel is arranged and an inner space where the pair of the first support panels and the pair of the second support panels are mounted,
wherein the case includes a first hole formed in a first end of the case and a second hole formed in a second end of the case,
wherein opposite ends of the first grooves are open toward the inner space of the case to induce air flow in the inner space of the case, and
wherein first ends of the second grooves are in communication with the outside via the first hole and second ends of the second grooves are in communication with the outside via the second hole to allow external air to flow therethrough.

3. The digital signage according to claim 2, wherein the case further comprises a pair of glasses spaced apart a predetermined distance from the first surfaces of the display panels, respectively, to provide spaces to allow air curtains to be formed between the respective glass and the first surface of the display panel such that air flows in the second direction between the respective glass and the first surface of the display panel,
wherein first ends of said spaces are connected to first ends of the second grooves, respectively, and second ends of each space is connected to second ends of the second grooves, respectively.

4. The digital signage according to claim 1, further comprising a pair of filters provided in the first ends of said spaces, respectively, each of the first ends being an inlet to draw external air therein.

* * * * *